US011791366B2

(12) United States Patent
Kido

(10) Patent No.: US 11,791,366 B2
(45) Date of Patent: Oct. 17, 2023

(54) SOLID-STATE IMAGING DEVICE AND ELECTRONIC DEVICE

(71) Applicant: SONY GROUP CORPORATION, Tokyo (JP)

(72) Inventor: Hideo Kido, Kanagawa (JP)

(73) Assignee: SONY GROUP CORPORATION, Tokyo (JP)

(*) Notice: Subject to any disclaimer, the term of this patent is extended or adjusted under 35 U.S.C. 154(b) by 0 days.

(21) Appl. No.: 17/517,406

(22) Filed: Nov. 2, 2021

(65) Prior Publication Data
US 2022/0059602 A1 Feb. 24, 2022

Related U.S. Application Data

(63) Continuation of application No. 15/546,110, filed as application No. PCT/JP2016/051801 on Jan. 22, 2016, now Pat. No. 11,195,873.

(30) Foreign Application Priority Data

Feb. 5, 2015 (JP) .................................. 2015-021076

(51) Int. Cl.
*H01L 27/146* (2006.01)
*H04N 23/75* (2023.01)
(Continued)

(52) U.S. Cl.
CPC .. *H01L 27/14656* (2013.01); *H01L 27/14614* (2013.01); *H01L 27/14643* (2013.01);
(Continued)

(58) Field of Classification Search
CPC . H01L 27/144–14893; H01L 27/14656; H01L 27/14643; H01L 27/14614;
(Continued)

(56) References Cited

U.S. PATENT DOCUMENTS

| 7,218,346 | B1 | 5/2007 | Nakashiba |
|---|---|---|---|
| 11,195,873 | B2 | 12/2021 | Kido |

(Continued)

FOREIGN PATENT DOCUMENTS

| JP | 2000-059695 | 2/2000 |
|---|---|---|
| JP | 2010-114273 | 5/2010 |

(Continued)

OTHER PUBLICATIONS

International Search Report and Written Opinion for International (PCT) Patent Application No. PCT/JP2016/051801, dated Apr. 12, 2016, 8 pages.

(Continued)

*Primary Examiner* — Julio J Maldonado
*Assistant Examiner* — Stanetta D Isaac
(74) *Attorney, Agent, or Firm* — Sheridan Ross PC

(57) ABSTRACT

The present technology relates to a solid-state imaging device and an electronic device capable of improving a saturation characteristic. A photo diode is formed on a substrate, and a floating diffusion accumulates a signal charge read from the photo diode. A plurality of vertical gate electrodes is formed from a surface of the substrate in a depth direction in a region between the photo diode and the floating diffusion, and an overflow path is formed in a region interposed between a plurality of vertical gate electrodes. The present technology may be applied to a CMOS image sensor.

18 Claims, 13 Drawing Sheets

(51) Int. Cl.
*H04N 25/57* (2023.01)
*H04N 25/76* (2023.01)
*H04N 25/621* (2023.01)

(52) U.S. Cl.
CPC ............. *H04N 23/75* (2023.01); *H04N 25/57* (2023.01); *H04N 25/622* (2023.01); *H04N 25/76* (2023.01)

(58) Field of Classification Search
CPC ...... H04N 5/374; H04N 5/355; H04N 5/3592; H04N 5/238
See application file for complete search history.

(56) References Cited

U.S. PATENT DOCUMENTS

| | | |
|---|---|---|
| 2006/0011919 A1 | 1/2006 | Mouli |
| 2006/0081887 A1* | 4/2006 | Lyu .................. H01L 27/14603 257/E27.131 |
| 2009/0303371 A1 | 12/2009 | Watanabe et al. |
| 2011/0180860 A1 | 7/2011 | Yamada et al. |
| 2012/0217604 A1 | 8/2012 | Shibuki |
| 2013/0009224 A1 | 1/2013 | Ohri |
| 2014/0008705 A1* | 1/2014 | Choi .................... H01L 29/045 257/255 |
| 2014/0151533 A1 | 6/2014 | Watanabe et al. |
| 2015/0021461 A1 | 1/2015 | Nishihara |
| 2015/0069471 A1 | 3/2015 | Kawamura |
| 2015/0357363 A1 | 12/2015 | Kawamura |
| 2016/0219236 A1 | 7/2016 | Maeda |

FOREIGN PATENT DOCUMENTS

| | | |
|---|---|---|
| JP | 2011-155152 | 8/2011 |
| JP | 2013-016675 | 1/2013 |
| JP | 2013-026264 | 2/2013 |
| JP | 2015-053411 | 3/2015 |
| WO | WO 2013/128998 | 9/2013 |

OTHER PUBLICATIONS

Official Action for U.S. Appl. No. 15/546,110, dated Dec. 27, 2017, 6 pages.
Official Action for U.S. Appl. No. 15/546,110, dated Jul. 26, 2018, 8 pages.
Official Action for U.S. Appl. No. 15/546,110, dated Feb. 26, 2019, 10 pages.
Official Action for U.S. Appl. No. 15/546,110, dated Sep. 26, 2019, 9 pages.
Official Action for U.S. Appl. No. 15/546,110, dated Jun. 12, 2020, 9 pages.
Official Action for U.S. Appl. No. 15/546,110, dated Feb. 19, 2021, 9 pages.
Notice of Allowance for U.S. Appl. No. 15/546,110, dated Aug. 5, 2021, 8 pages.

* cited by examiner

SOLID-STATE IMAGING DEVICE AND ELECTRONIC DEVICE

CROSS REFERENCE TO RELATED APPLICATIONS

This application is a continuation of and claims priority to U.S. patent application Ser. No. 15/546,110, filed Jul. 25, 2017, which is a national stage application under 35 U.S.C. 371 and claims the benefit of PCT Application No. PCT/JP2016/051801 having an international filing date of Jan. 22, 2016, which designated the United States, which PCT application claimed the benefit of Japanese Patent Application No. 2015-021076, filed Feb. 5, 2015, the disclosures of which are incorporated herein by reference in their entirety.

TECHNICAL FIELD

The present technology relates to a solid-state imaging device and an electronic device, and especially relates to the solid-state imaging device and the electronic device capable of improving a saturation characteristic.

BACKGROUND ART

A solid-state image sensor provided with a transfer gate electrode obtained by integrally forming a planar gate electrode and a vertical gate electrode is conventionally known.

A solid-state image sensor in which a vertical gate electrode is unevenly located in a gate width direction is suggested as one of such solid-state image sensor (for example, refer to Patent Document 1). According to such a configuration, potential of an overflow path may be controlled and a blooming characteristic may be improved.

CITATION LIST

Patent Document

Patent Document 1: Japanese Patent Application Laid-Open No. 2013-26264

SUMMARY OF THE INVENTION

Problems to be Solved by the Invention

However, the above-described configuration cannot deal with a phenomenon that a saturation signal amount decreases with time when a mechanical shutter is operated. Therefore, a sufficient saturation characteristic cannot be obtained.

The present technology is achieved in view of such a condition and an object thereof is to improve the saturation characteristic.

Solutions to Problems

A solid-state imaging device according to one aspect of the present technology is provided with a photo diode formed on a substrate, a floating diffusion which accumulates a signal charge read from the photo diode, a plurality of vertical gate electrodes formed from a surface of the substrate in a depth direction in a region between the photo diode and the floating diffusion, and an overflow path formed in a region interposed between the plurality of vertical gate electrodes.

A planar gate electrode formed so as to stride across the photo diode and the floating diffusion may be further provided on the substrate, and the vertical gate electrodes may be formed integral with the planar gate electrode.

The overflow path may be formed in a region shallower than the plurality of vertical gate electrodes.

A driving circuit which applies predetermined voltage to the plurality of vertical gate electrodes may be further provided, and the driving circuit may apply negative voltage larger than the negative voltage applied until then to the plurality of vertical gate electrodes at timing at which an opening mechanical shutter closes.

An electronic device according to one aspect of the present technology is provided with a solid-state imaging device including a photo diode formed on a substrate, a floating diffusion which accumulates a signal charge read from the photo diode, a plurality of vertical gate electrodes formed from a surface of the substrate in a depth direction in a region between the photo diode and the floating diffusion, and an overflow path formed in a region interposed between the plurality of vertical gate electrodes.

According to one aspect of the present technology, a plurality of vertical gate electrodes is formed from a surface of a substrate in a depth direction in a region between a photo diode and a floating diffusion, and an overflow path is formed in a region interposed between a plurality of vertical gate electrodes.

Effects of the Invention

According to one aspect of the present technology, it becomes possible to improve a saturation characteristic.

MODE FOR CARRYING OUT THE INVENTION

An embodiment of the present technology is hereinafter described with reference to the drawings.

<Relationship between Operation of Mechanical Shutter and Saturation Signal Amount>

Figure 1:
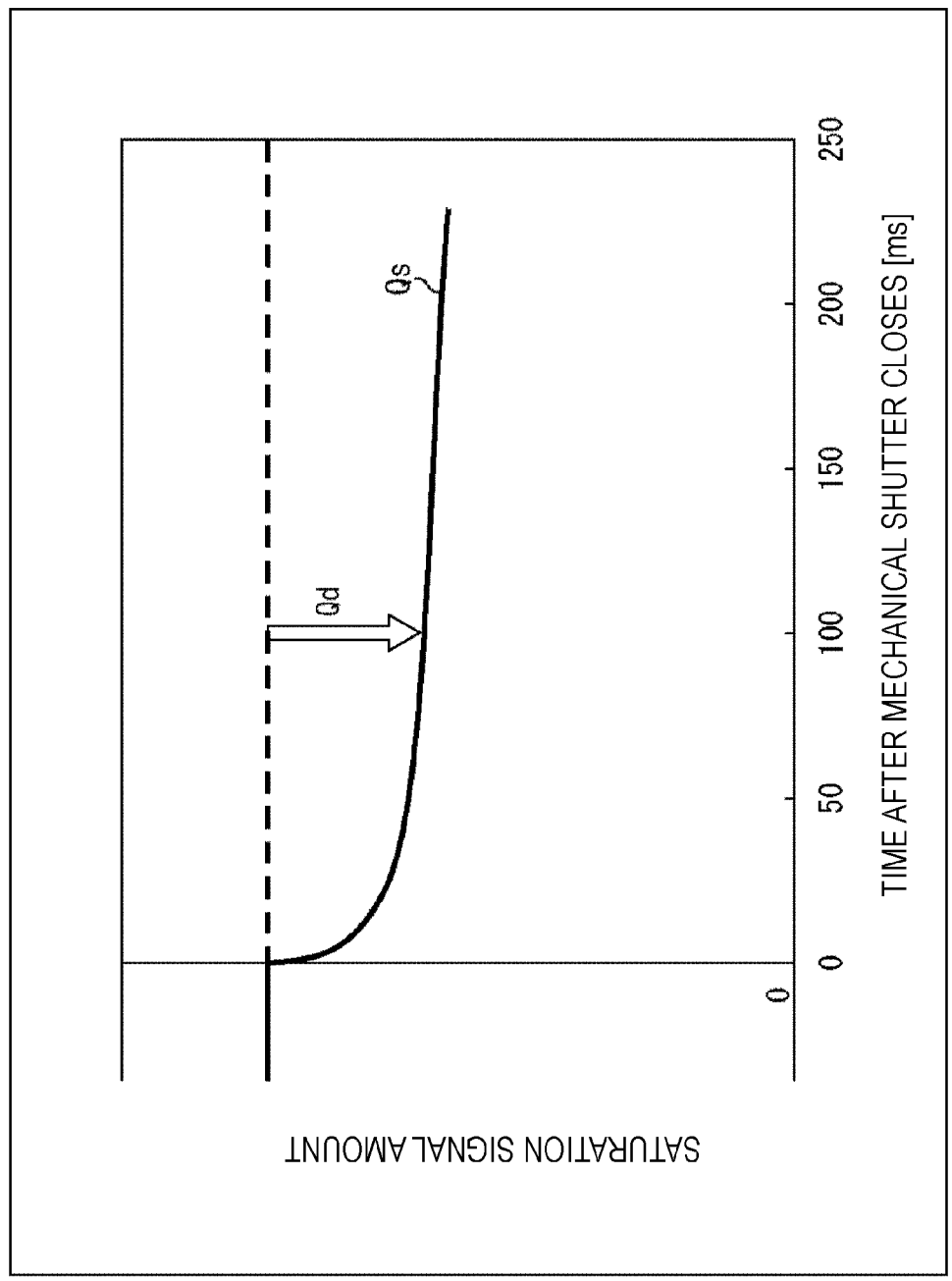
FIG. 1 is a view illustrating a relationship between operation of a mechanical shutter and a saturation signal amount.

Conventionally, in a camera equipped with both a mechanical shutter and an electronic shutter, a phenomenon that a saturation signal amount Qs of each pixel of an image sensor decreases with time when the mechanical shutter operates occurs as illustrated in FIG. 1. In an example in FIG. 1, 100 ms after the mechanical shutter closes, the saturation signal amount decreases by a predetermined signal amount Qd.

When the mechanical shutter closes, light does not enter a photo diode. Therefore, a state of balance between electrons generated in the photo diode and diffusion current components leaking out of the photo diode (specifically, to a floating diffusion side) is lost. With this arrangement, the above-described phenomenon occurs. As a result, a sufficient saturation characteristic cannot be obtained and a dynamic range is deteriorated.

Therefore, a configuration to mitigate a decrease in saturation signal amount after the mechanical shutter closes is hereinafter described.

<Configuration Example of CMOS Image Sensor>

Figure 2:
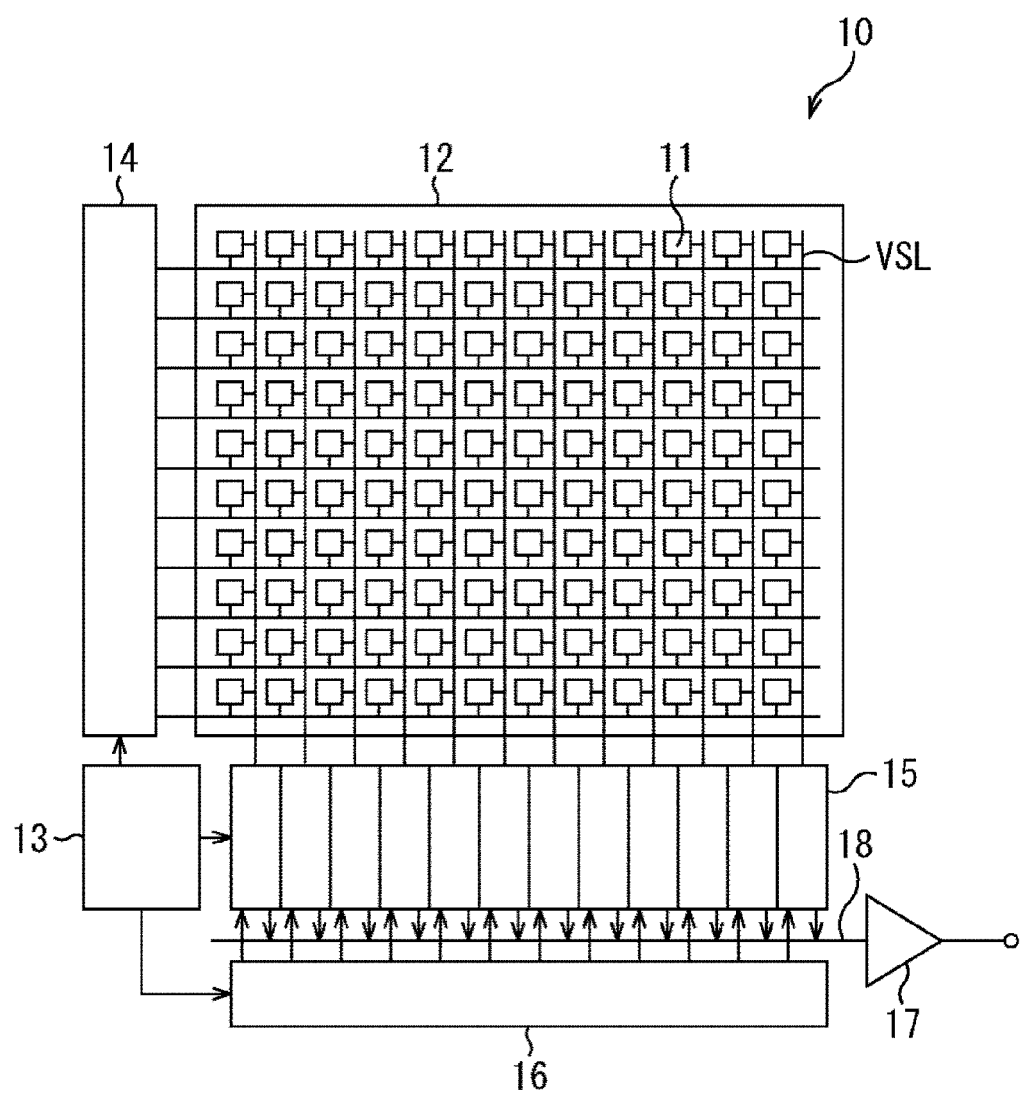
FIG. 2 is a block diagram illustrating a configuration example of a CMOS image sensor of the present technology.

FIG. 2 is a view illustrating a principal configuration example of a complementary metal oxide semiconductor (CMOS) image sensor. A CMOS image sensor 10 illustrated in FIG. 2 is an example of a solid-state imaging device to which the present technology is applied. The CMOS image sensor 10 is configured as a rear-surface irradiation image sensor. Meanwhile, it goes without saying that the present technology may also be applied to the image sensor having another configuration.

The CMOS image sensor 10 is formed of a pixel array 12 in which pixels 11 are regularly arranged in a two-dimensional manner and a peripheral circuit unit. The pixel 11 includes a photoelectric conversion element (photo diode) and a plurality of pixel transistors. The configuration is formed on a semiconductor substrate (chip) not illustrated.

A plurality of pixel transistors includes three transistors which are a transfer transistor, a reset transistor, and an amplification transistor, for example. Furthermore, a plurality of pixel transistors may also include four transistors with a selection transistor added to them.

The peripheral circuit unit is formed of a control circuit 13, a vertical driving circuit 14, a column signal processing circuit 15, a horizontal driving circuit 16, and an output circuit 17.

The control circuit 13 generates a clock signal and a control signal which serve as a reference of operation of the vertical driving circuit 14, the column signal processing circuit 15, and the horizontal driving circuit 16 on the basis of a vertical synchronization signal, a horizontal synchronization signal, and a master clock. The control circuit 13 supplies the signals to the vertical driving circuit 14, the column signal processing circuit 15, and the horizontal driving circuit 16.

The vertical driving circuit 14 is formed of a shift register, for example. The vertical driving circuit 14 selectively scans the pixels 11 of the pixel array 12 sequentially in a vertical direction row by row. Then, the vertical driving circuit 14 supplies a pixel signal based on a signal charge generated according to a light receiving amount in the photo diode of each pixel 11 to the column signal processing circuit 15 through a vertical signal line VSL.

The column signal processing circuit 15 is arranged for each column of the pixels 11. The column signal processing circuit 15 performs a signal process such as noise removal by using a signal from a black reference pixel (pixel formed around an effective pixel region) for each pixel column on the pixel signals output from the pixels 11 of one row. Specifically, the column signal processing circuit 15 performs the signal process such as correlated double sampling (CDS) for removing a fixed pattern noise specific to the pixel 11 and signal amplification. A horizontal selection switch (not illustrated) is provided so as to be connected to a horizontal signal line 18 on an output stage of the column signal processing circuit 15.

The horizontal driving circuit 16 is formed of a shift register, for example. The horizontal driving circuit 16 selects each of the column signal processing circuits 15 in turn by sequentially outputting a horizontal scanning pulse. Then, the horizontal driving circuit 16 outputs the pixel signal from each column signal processing circuit 15 to the horizontal signal line 18.

The output circuit 17 performs a signal process on the signals sequentially supplied from the column signal processing circuits 15 through the horizontal signal line 18 to output.

<Configuration Example of Pixel>

Figure 3:
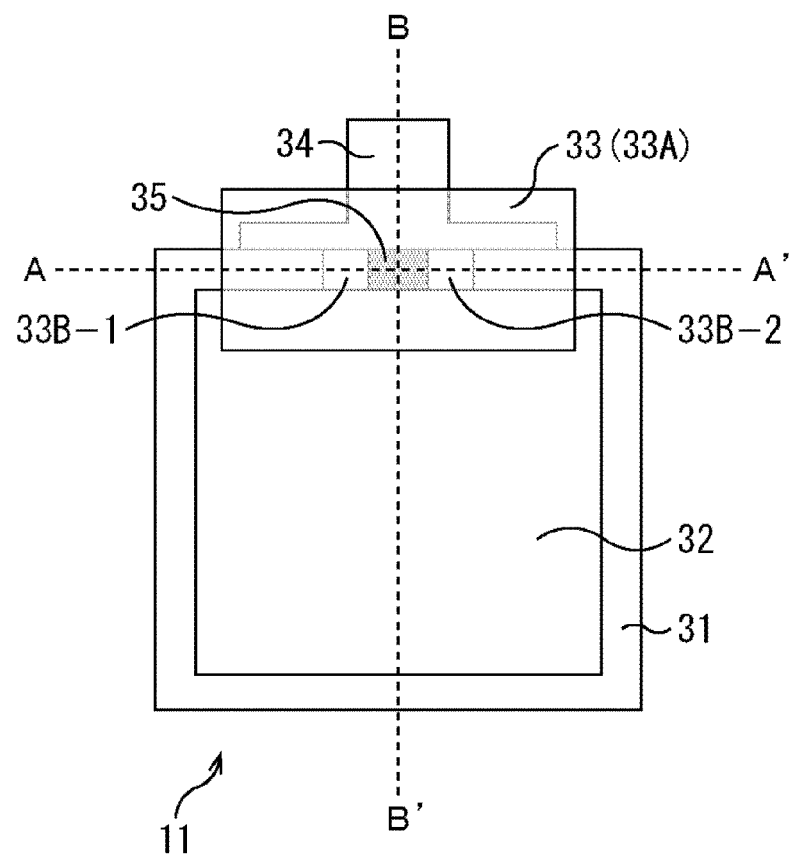
FIG. 3 is a planar view illustrating a configuration example of a pixel.
Figure 4:
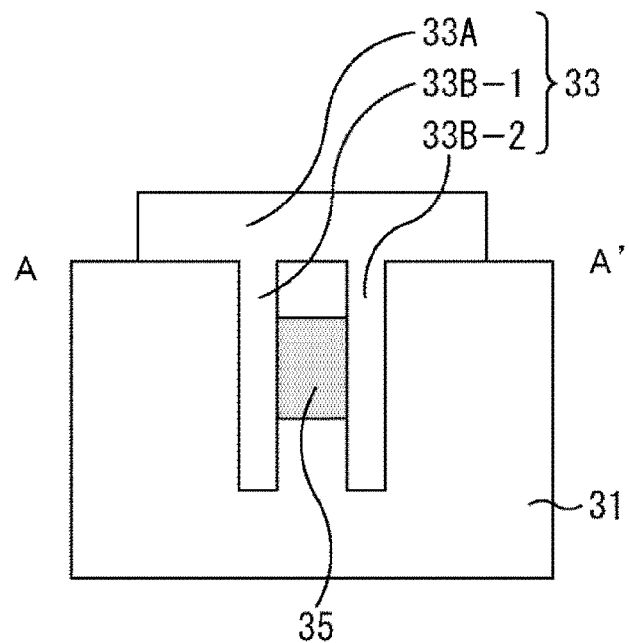
FIG. 4 is a cross-sectional view illustrating the configuration example of the pixel.
Figure 5:
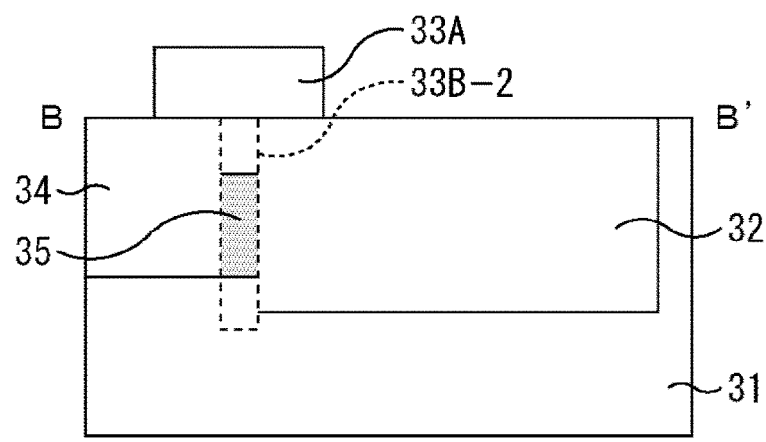
FIG. 5 is another cross-sectional view illustrating the configuration example of the pixel.

Next, a configuration example of the pixel 11 is described with reference to FIGS. 3 to 5. FIG. 3 is a planar view illustrating the configuration example of the pixel 11. FIG. 4 is a cross-sectional view taken along line A-A' of the pixel 11 illustrated in FIG. 3, and FIG. 5 is a cross-sectional view taken along line B-B' of the pixel 11 illustrated in FIG. 3.

In the pixel 11, a photo diode (PD) 32 is formed on a semiconductor substrate 31.

The pixel 11 is also provided with a vertical transistor (Tr) which reads the signal charge generated in the PD 32. The vertical Tr is formed of a transfer gate electrode 33 and a floating diffusion (FD) 34.

The transfer gate electrode 33 is obtained by integrally forming a planar gate electrode 33A and vertical gate electrodes 33B-1 and 33B-2. The planar gate electrode 33A is formed so as to stride across the PD 32 and the FD 34 on the semiconductor substrate 31. The vertical gate electrodes 33B-1 and 33B-2 are formed to have columnar shapes from a surface of the semiconductor substrate 31 in a depth direction in a region between the PD 32 and the FD 34 under the planar gate electrode 33A.

The FD 34 is formed on the surface of the semiconductor substrate 31 in a position opposed to the PD 32 across the transfer gate electrode 33. The FD 34 accumulates the signal charge read from the PD 32 through the transfer gate electrode 33.

Also, an overflow path 35 is formed in a region interposed between the vertical gate electrode 33B-1 and the vertical gate electrode 33B-2. The overflow path 35 is formed in a region shallower than the vertical gate electrodes 33B-1 and 33B-2. The overflow path 35 is formed of impurities injected into the region interposed between the vertical gate electrode 33B-1 and the vertical gate electrode 33B-2.

In the vertical Tr, positive voltage is applied to the transfer gate electrode 33 at the time of reading, and according to this, potential immediately under the transfer gate electrode 33 changes. Then, the signal charge accumulated in the PD 32 passes through a region around the vertical gate electrodes 33B-1 and 33B-2 of the transfer gate electrode 33 to be transferred to the FD 34. That is to say, lateral reading is performed.

Also, the overflow path 35 serves as a path for transferring the signal charge beyond the saturation signal amount of the PD 32 (surplus charge) to the FD 34 when the signal charge is accumulated in the PD 32.

Figure 6:
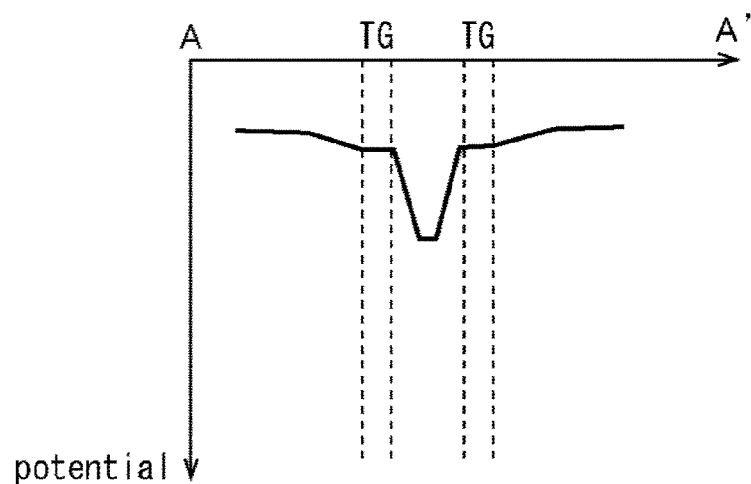
FIG. 6 is a view illustrating potential of the cross-section in FIG. 4.

FIG. 6 illustrates a potential cross-section in a line A-A' direction in FIG. 3.

As illustrated in FIG. 6, when negative voltage is applied to the transfer gate electrode 33, the potential of the region interposed between the vertical gate electrode 33B-1 and the vertical gate electrode 33B-2 becomes lower than the potential around the same in the line A-A' direction due to an effect of the potential applied to the vertical gate electrodes 33B-1 and 33B-2 (TG). That is to say, the overflow path 35 is modulated and the PD 32 and the FD 34 are electrically connected to each other.

In this manner, since the overflow path 35 is formed in the region interposed between the vertical gate electrode 33B-1 and the vertical gate electrode 33B-2, the overflow path 35 may be modulated in two directions.

Figure 7:
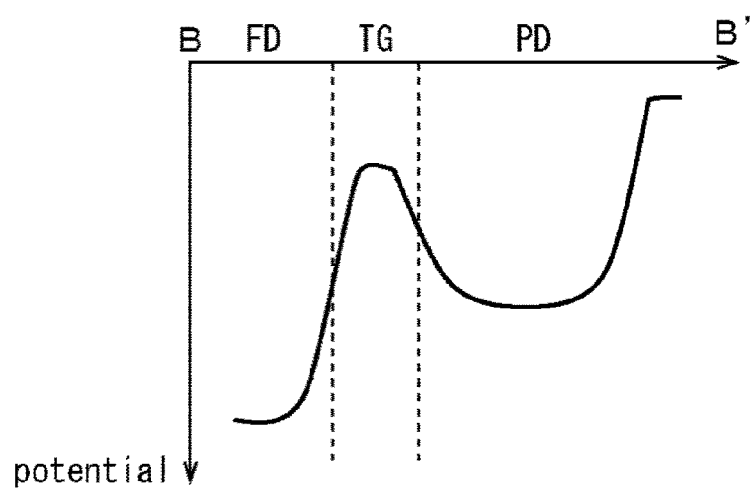
FIG. 7 is a view illustrating potential of the cross-section in FIG. 5.

FIG. 7 illustrates a potential cross-section in a line B-B' direction in FIG. 3.

As illustrated in FIG. 7, the potential of a region of a transfer path of the charge under the transfer gate electrode 33 (TG), that is to say, the overflow path 35 is higher than that of the PD 32 and the FD 34. When the negative voltage is applied to the transfer gate electrode 33, the potential of the overflow path 35 becomes higher than the potential around the same in the line B-B' direction due to the effect of the potential applied to the vertical gate electrodes 33B-1 and 33B-2. The potential which becomes higher serves as an overflow barrier.

<Modulation of Overflow Path when Mechanical Shutter Operates>

Herein, the modulation of the overflow path 35 when the mechanical shutter operates is described with reference to FIGS. 8 and 9. Meanwhile, it is herein supposed that the CMOS image sensor 10 is mounted on the camera provided with the mechanical shutter.

Figure 8:
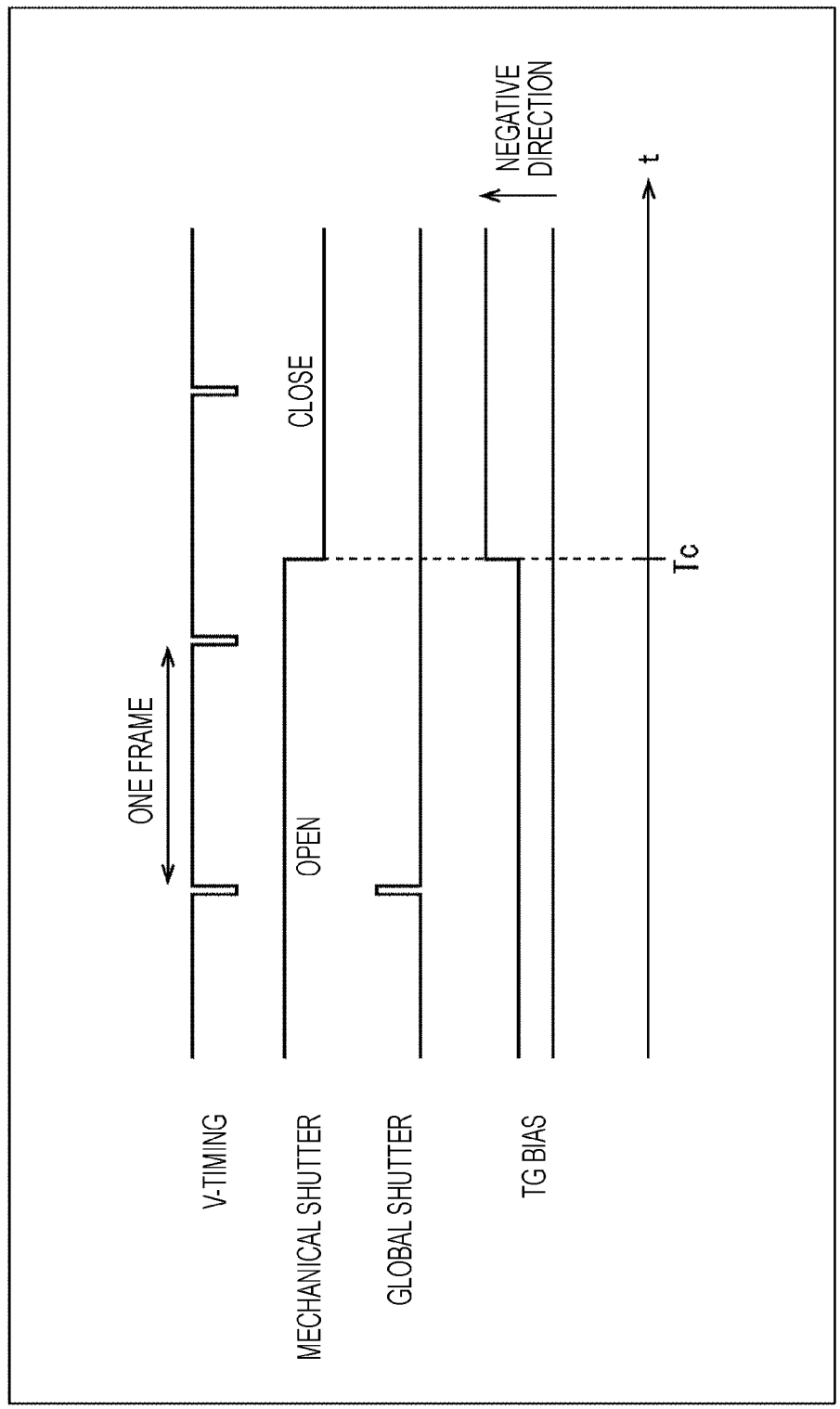
FIG. 8 is a timing chart illustrating each signal when the mechanical shutter operates.
Figure 9:
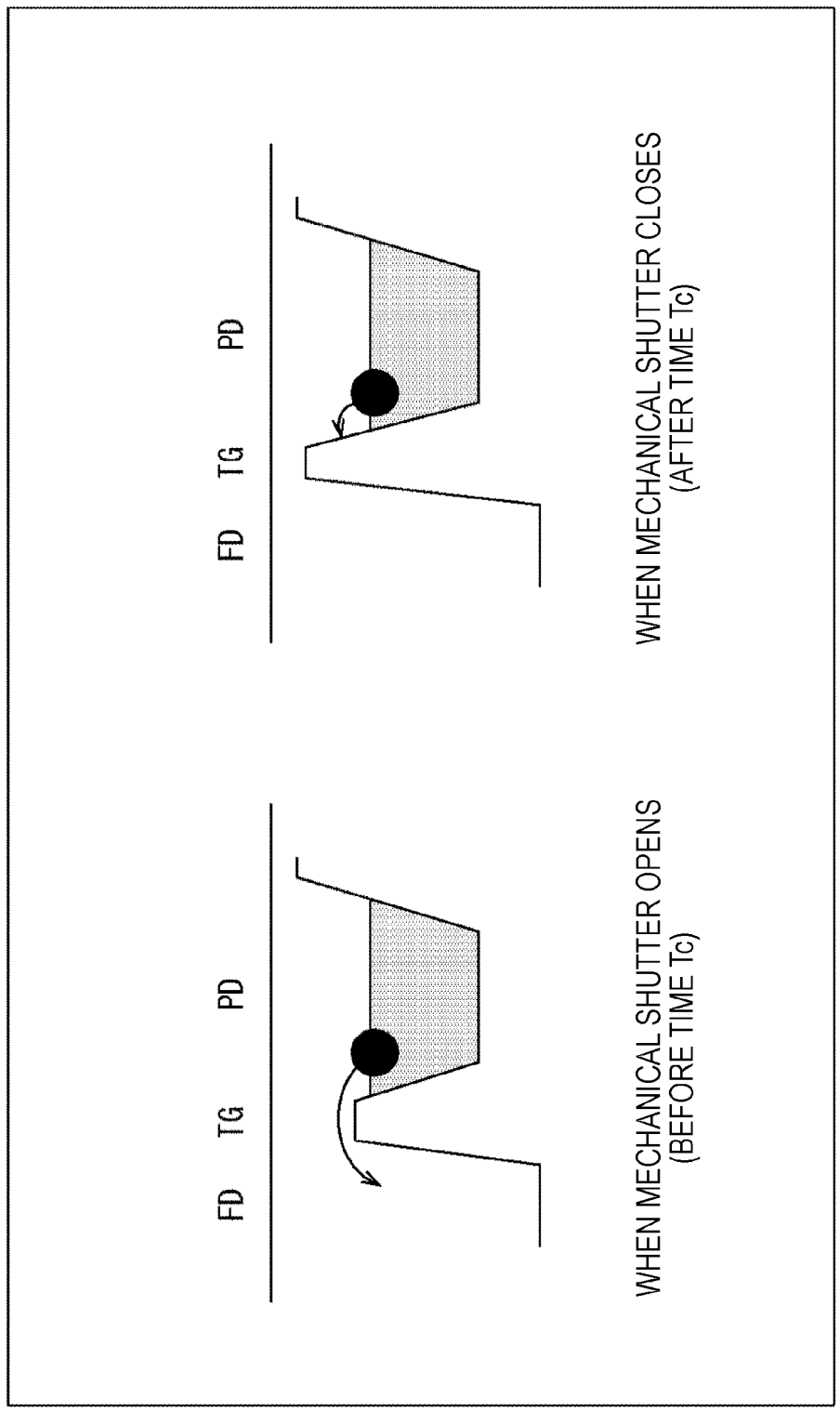
FIG. 9 is a view illustrating a state of modulation of an overflow path.

FIG. 8 illustrates a timing chart of the vertical synchronization signal (V-timing), a driving signal of the mechanical shutter, a driving signal of a global shutter, and a bias (TG bias) of the transfer gate electrode 33 when the mechanical shutter of the camera operates. Each signal in FIG. 8 is output on the basis of the control signal generated by the control circuit 13. Also, FIG. 9 illustrates a state of the modulation of the overflow path according to the operation of the mechanical shutter.

As illustrated in FIG. 8, in the CMOS image sensor 10, the effective pixel region is scanned within one frame period of the vertical synchronization signal.

When a trigger pulse to the global shutter is output in a state in which the mechanical shutter opens, exposure is started. At that time, predetermined negative voltage is applied to the transfer gate electrode 33 (vertical gate electrodes 33B-1 and 33B-2) by the vertical driving circuit 14. That is to say, as illustrated on a left side in FIG. 9, the overflow barrier of predetermined potential is formed between the PD 32 and the FD 34. With this arrangement, the state of balance between the electrons generated in the PD 32 and the diffusion current components leaking from the PD 32 to the FD 34 side is maintained.

Then, at time Tc, at timing at which the opened mechanical shutter closes, the negative voltage larger than the negative voltage applied until then is applied to the transfer gate electrode 33 (vertical gate electrodes 33B-1 and 33B-2) by the vertical driving circuit 14. That is to say, as illustrated on a right side in FIG. 9, the overflow barrier of the potential higher than that of the state illustrated on the left side in FIG. 9 is formed between the PD 32 and the FD 34.

As described above, since the overflow path 35 formed in the region interposed between the vertical gate electrode 33B-1 and the vertical gate electrode 33B-2 is modulated in the two directions, a degree of modulation of the overflow barrier may be made higher. That is to say, it becomes possible to dynamically control the potential of the overflow barrier. With this arrangement, it becomes possible to prevent the saturation signal amount from decreasing with time when the mechanical shutter operates and improve the saturation characteristic.

<Variation>

Although the configuration example in which the overflow path is formed in the region interposed by the two vertical gate electrodes is heretofore described, the number of the vertical gate electrodes is not limited to two. Therefore, a configuration example provided with three or more vertical gate electrodes is hereinafter described.

(Variation 1)

Figure 10:
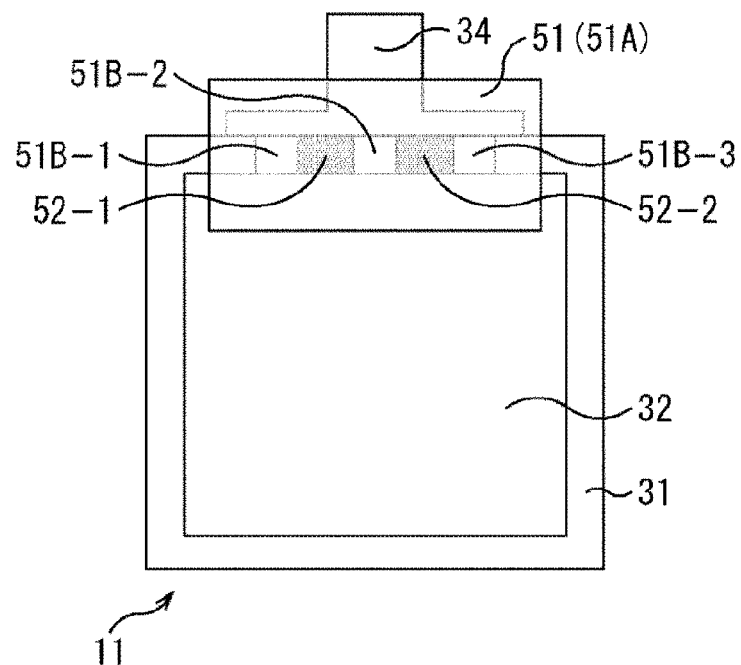
FIG. 10 is a planar view illustrating another configuration example of the pixel.
Figure 11:
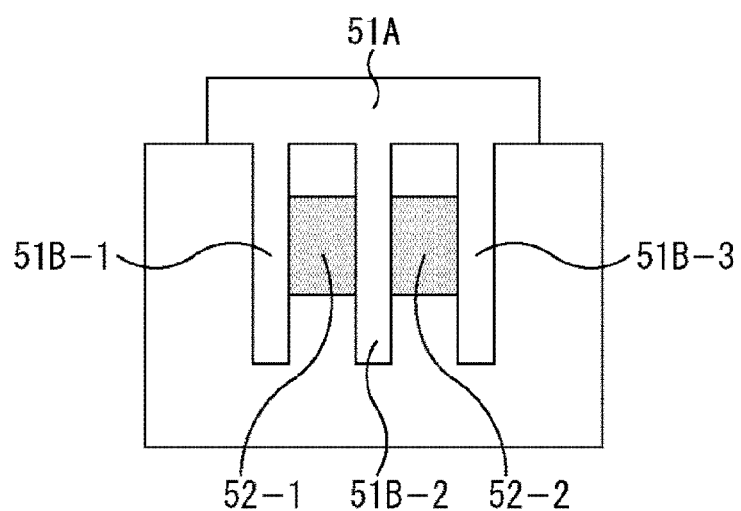
FIG. 11 is a cross-sectional view illustrating another configuration example of the pixel.

FIGS. 10 and 11 illustrate another configuration example of a pixel 11. FIG. 10 is a planar view illustrating the configuration example of the pixel 11. FIG. 11 is a cross-sectional view corresponding to the cross-sectional view in FIG. 3 of the pixel 11 illustrated in FIG. 10.

Meanwhile, in FIGS. 10 and 11, the same reference sign is assigned to a configuration similar to that in FIGS. 3 and 4 and the description thereof is omitted.

A transfer gate electrode 51 is obtained by integrally forming a planar gate electrode 51A and vertical gate electrodes 51B-1, 51B-2, and 51B-3. The planar gate electrode 51A is formed so as to stride across a PD 32 and a FD 34 on a semiconductor substrate 31. The vertical gate electrodes 51B-1, 51B-2, and 51B-3 are formed to have columnar shapes from a surface of the semiconductor substrate 31 in a depth direction in a region between the PD 32 and the FD 34 under the planar gate electrode 51A.

An overflow path 52-1 is formed in a region interposed between the vertical gate electrode 51B-1 and the vertical gate electrode 51B-2. Also, an overflow path 52-2 is formed in a region interposed between the vertical gate electrode 51B-2 and the vertical gate electrode 51B-3. The overflow paths 52-1 and 52-2 are formed in regions shallower than the vertical gate electrodes 51B-1, 51B-2, and 51B-3. The overflow path 52-1 is formed of impurities injected into the region interposed between the vertical gate electrode 51B-1 and the vertical gate electrode 51B-2. Also, the overflow path 52-2 is formed of impurities injected into the region interposed between the vertical gate electrode 51B-2 and the vertical gate electrode 51B-3.

By such a configuration, it is possible to modulate the overflow path 52-1 formed in the region interposed between the vertical gate electrode 51B-1 and the vertical gate electrode 51B-2 in two directions and modulate the overflow path 52-2 formed in the region interposed between the vertical gate electrode 51B-2 and the vertical gate electrode 51B-3 in two directions, so that a degree of modulation of the overflow barrier may be made higher. As a result, it becomes possible to prevent a saturation signal amount from decreasing with time when a mechanical shutter operates and improve a saturation characteristic.

(Variation 2)

Figure 12:
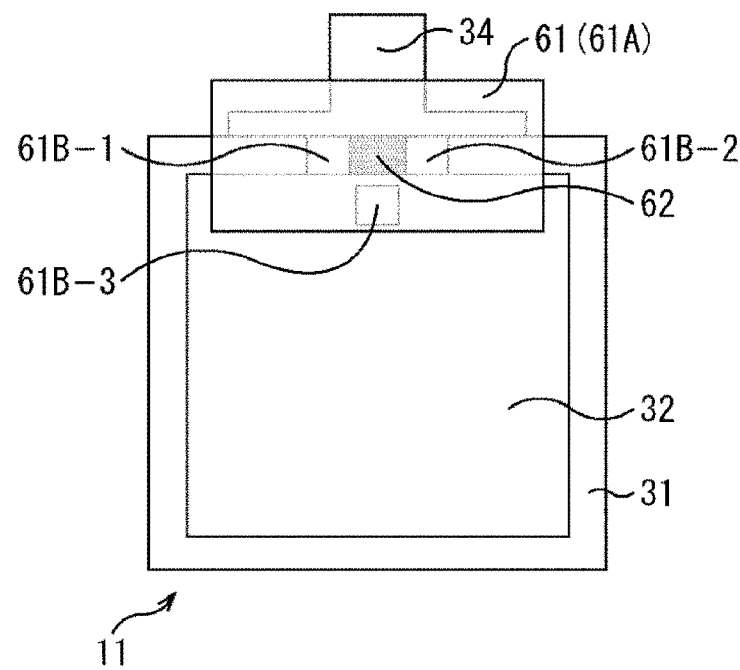
FIG. 12 is a planar view illustrating still another configuration example of the pixel.
Figure 13:
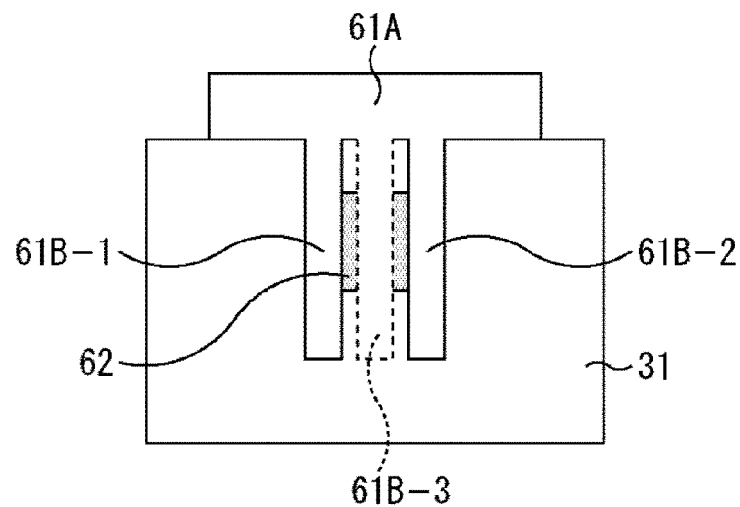
FIG. 13 is a cross-sectional view illustrating still another configuration example of the pixel.

FIGS. 12 and 13 illustrate still another configuration example of a pixel 11. FIG. 12 is a planar view illustrating the configuration example of the pixel 11. FIG. 13 is a cross-sectional view corresponding to the cross-sectional view in FIG. 3 of the pixel 11 illustrated in FIG. 12.

Meanwhile, in FIGS. 12 and 13, the same reference sign is assigned to a configuration similar to that in FIGS. 3 and 4 and the description thereof is omitted.

A transfer gate electrode 61 is obtained by integrally forming a planar gate electrode 61A and vertical gate electrodes 61B-1, 61B-2, and 61B-3. The planar gate electrode 61A is formed so as to stride across a PD 32 and a FD 34 on a semiconductor substrate 31. The vertical gate electrodes 61B-1, 61B-2, and 61B-3 are formed to have columnar shapes from a surface of the semiconductor substrate 31 in a depth direction under the planar gate electrode 61A.

An overflow path 62 is formed in a region interposed among the vertical gate electrode 61B-1, the vertical gate electrode 61B-2, and the vertical gate electrode 61B-3. The overflow path 62 is formed in a region shallower than the vertical gate electrodes 61B-1, 61B-2, and 61B-3. The overflow path 62 is formed of impurities injected into the region interposed among the vertical gate electrode 61B-1, the vertical gate electrode 61B-2, and the vertical gate electrode 61B-3.

By such a configuration, since the overflow path 62 formed in the region interposed among the vertical gate electrode 61B-1, the vertical gate electrode 61B-2, and the vertical gate electrode 61B-3 may be modulated in three directions, a degree of modulation of an overflow barrier may be made much higher. As a result, it becomes possible to prevent a saturation signal amount from decreasing with time when a mechanical shutter operates and improve a saturation characteristic.

(Variation 3)

Figure 14:
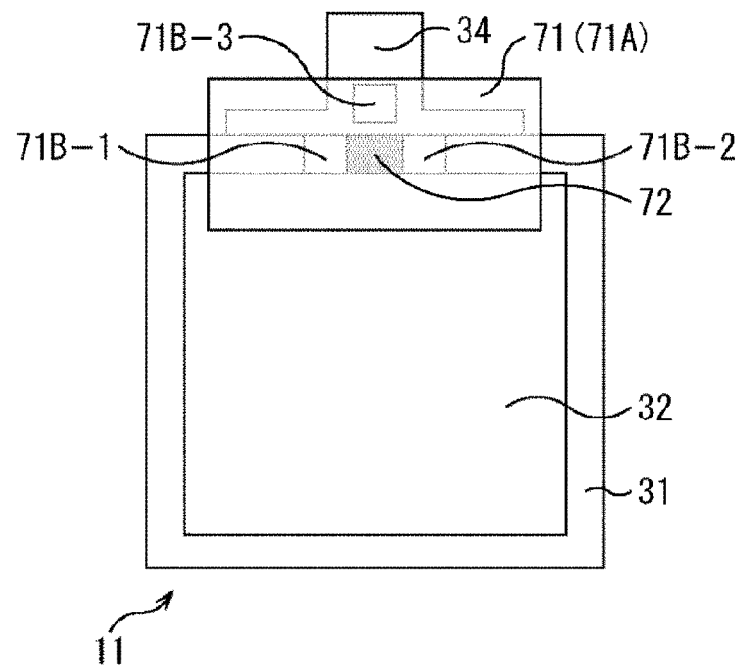
FIG. 14 is a planar view illustrating still another configuration example of the pixel.
Figure 15:
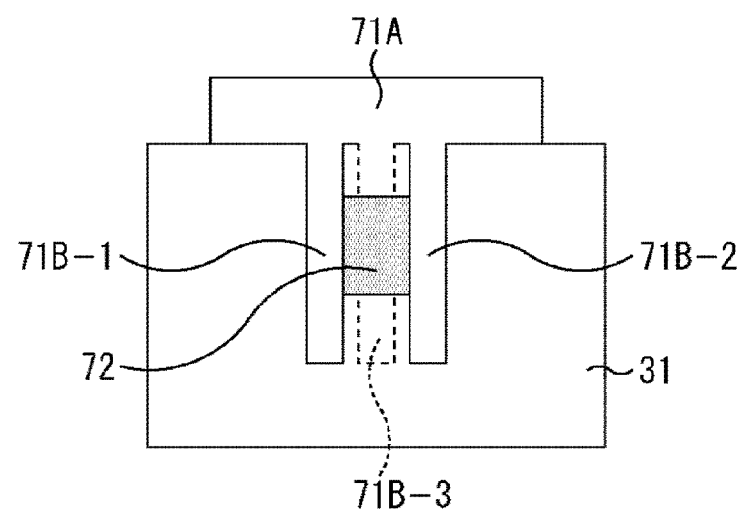
FIG. 15 is a cross-sectional view illustrating still another configuration example of the pixel.

FIGS. 14 and 15 illustrate still another configuration example of a pixel 11. FIG. 14 is a planar view illustrating the configuration example of the pixel 11. FIG. 15 is a cross-sectional view corresponding to the cross-sectional view in FIG. 3 of the pixel 11 illustrated in FIG. 14.

Meanwhile, in FIGS. 14 and 15, the same reference sign is assigned to a configuration similar to that in FIGS. 3 and 4 and the description thereof is omitted.

A transfer gate electrode 71 is obtained by integrally forming a planar gate electrode 71A and vertical gate electrodes 71B-1, 71B-2, and 71B-3. The planar gate electrode 71A is formed so as to stride across a PD 32 and a FD 34 on a semiconductor substrate 31. The vertical gate electrodes 71B-1, 71B-2, and 71B-3 are formed to have columnar shapes from a surface of the semiconductor substrate 31 in a depth direction under the planar gate electrode 71A.

An overflow path 72 is formed in a region interposed among the vertical gate electrode 71B-1, the vertical gate electrode 71B-2, and the vertical gate electrode 71B-3. The overflow path 72 is formed in a region shallower than the vertical gate electrodes 71B-1, 71B-2, and 71B-3. The overflow path 72 is formed of impurities injected into the region interposed among the vertical gate electrode 71B-1, the vertical gate electrode 71B-2, and the vertical gate electrode 71B-3.

By such a configuration, since the overflow path 72 formed in the region interposed among the vertical gate electrode 71B-1, the vertical gate electrode 71B-2, and the vertical gate electrode 71B-3 may be modulated in three directions, a degree of modulation of an overflow barrier may be made much higher. As a result, it becomes possible to prevent a saturation signal amount from decreasing with time when a mechanical shutter operates and improve a saturation characteristic.

(Variation 4)

Figure 16:
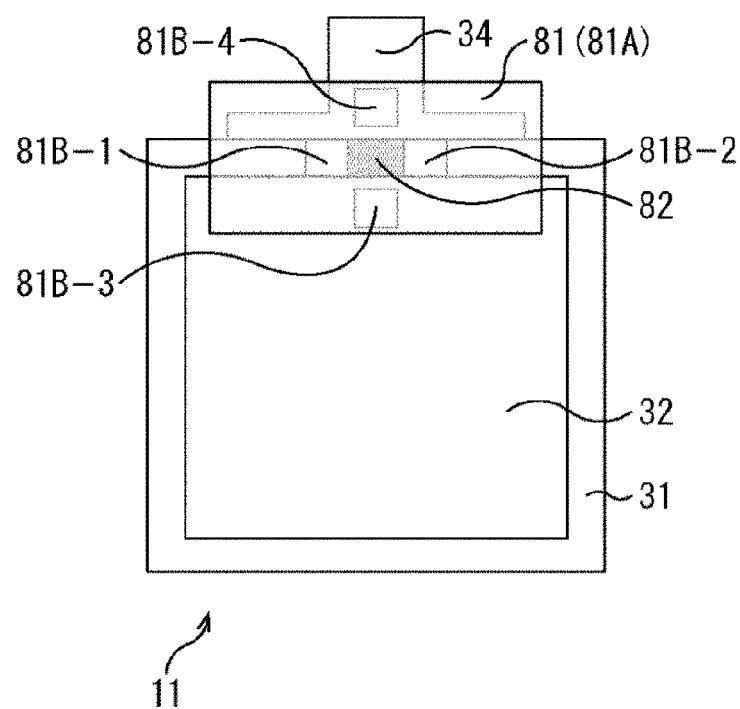
FIG. 16 is a planar view illustrating still another configuration example of the pixel.

FIG. 16 illustrates still another configuration example of a pixel 11. FIG. 16 is a planar view illustrating the configuration example of the pixel 11.

Meanwhile, in FIG. 16, the same reference sign is assigned to a configuration similar to that in FIG. 3 and the description thereof is omitted.

A transfer gate electrode 81 is obtained by integrally forming a planar gate electrode 81A and vertical gate electrodes 81B-1, 81B-2, 81B-3, and 81B-4. The vertical gate electrodes 81B-1, 81B-2, 81B-3, and 81B-4 are obtained by combining vertical gate electrodes 61B-1, 61B-2, and 61B-3 in FIGS. 12 and 13 and a vertical gate electrode 71B-3 in FIGS. 14 and 15.

By such a configuration, since the overflow path 82 formed in the region interposed among the vertical gate electrode 81B-1, the vertical gate electrode 81B-2, the vertical gate electrode 81B-3, and the vertical gate electrode 81B-4 may be modulated in four directions, a degree of modulation of an overflow barrier may be made much higher. As a result, it becomes possible to prevent a saturation signal amount from decreasing with time when a mechanical shutter operates and improve a saturation characteristic.

<Configuration Example of Electronic Device>

Next, a configuration example of an electronic device provided with a solid-state imaging device of the present technology is described.

The solid-state imaging device of the present technology may be mounted on the electronic device such as a camera system such as a digital camera and a video camera, a mobile phone having an imaging function, and another device having an imaging function, for example.

Figure 17:
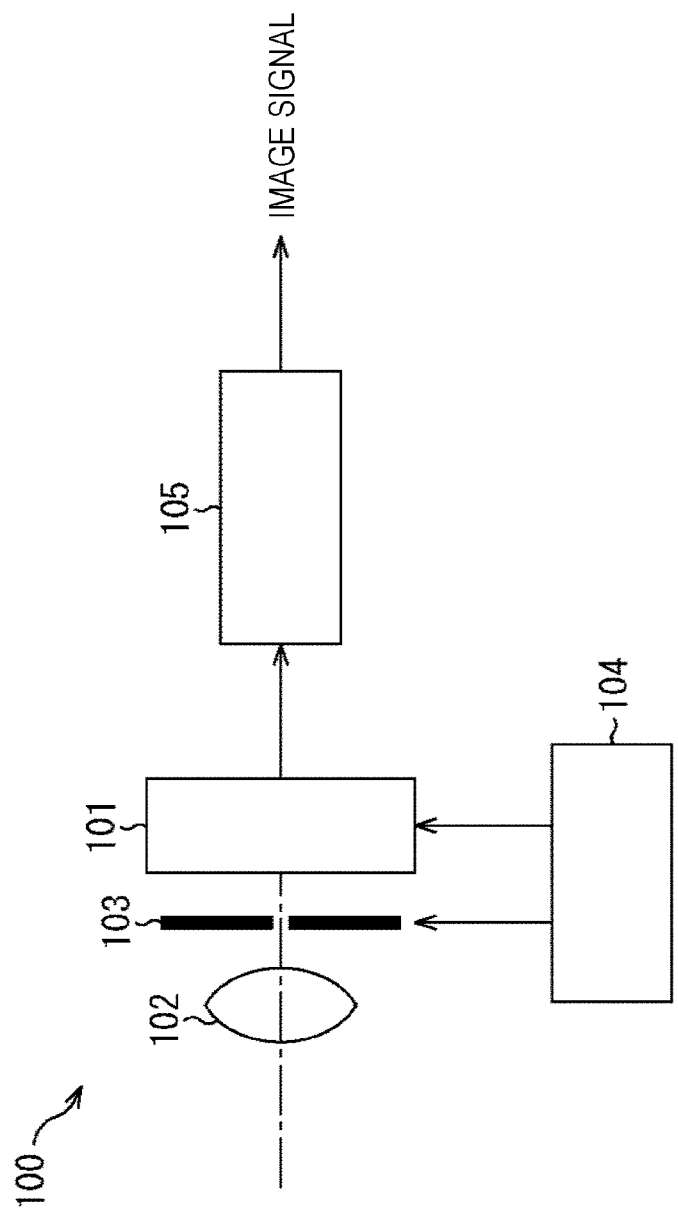
FIG. 17 is a block diagram illustrating a configuration example of an electronic device of the present technology.

FIG. 17 illustrates a configuration example of a camera capable of taking a still image as an example of the electronic device equipped with the solid-state imaging device of the present technology.

A camera 100 in FIG. 17 is provided with a solid-state imaging device 101, an optical system 102, a shutter device 103, a driving circuit 104, and a signal processing circuit 105.

A CMOS image sensor 10 including a pixel 11 of the above-described embodiment (including variations) may be applied to the solid-state imaging device 101.

The optical system (optical lens) 102 forms an image of image light (incident light) from a subject on an imaging surface of the solid-state imaging device 101. With this arrangement, signal charges are accumulated in each pixel of the solid-state imaging device 101 for a certain period. Meanwhile, the optical system 102 may also be formed of an optical lens group including a plurality of optical lenses.

The shutter device 103 is provided between the solid-state imaging device 101 and the optical system 102. The shutter device 103 configured as a mechanical shutter controls light irradiation period and light shielding period of the incident light to the solid-state imaging device 101.

The driving circuit 104 supplies a driving signal (timing signal) to the solid-state imaging device 101 and the shutter device 103. Then, the driving circuit 104 controls signal outputting operation of the solid-state imaging device 101 to the signal processing circuit 105 and shutter operation of the shutter device 103 by the supplied driving signal. That is to say, in this example, signal transfer from the solid-state imaging device 101 to the signal processing circuit 105 is performed by the driving signal supplied from the driving circuit 104.

The signal processing circuit 105 applies various signal processes to the signal transferred from the solid-state imaging device 101. The signal (image signal) to which the various signal processes are applied is stored in a storage medium such as a memory (not illustrated) and output to a monitor (not illustrated).

As described above, it is possible to improve a saturation characteristic by using the CMOS image sensor 10 including the pixel 11 of the above-described embodiment as the solid-state imaging device 101. That is to say, a dynamic range may be improved, so that the image obtained by imaging of the camera 100 may be made a high gradation image.

Meanwhile, the electronic device provided with the solid-state imaging device (image sensor) to which the present technology is applied may have another configuration in addition to the above-described configuration.

<Usage Example of Image Sensor>

Finally, a usage example of an image sensor to which the present technology is applied is described.

Figure 18:
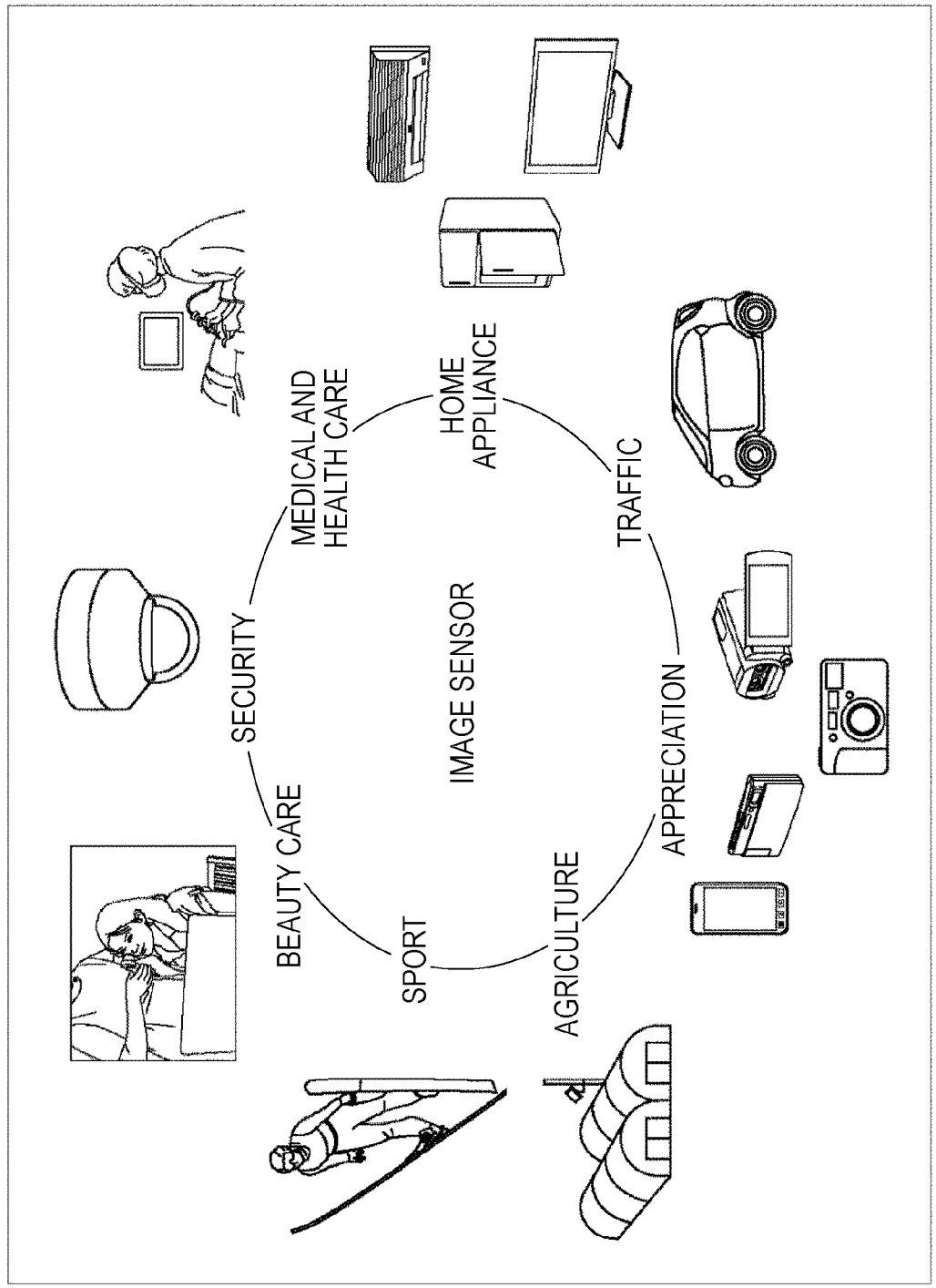
FIG. 18 is a view illustrating a usage example to use an image sensor.

FIG. 18 is a view illustrating the usage example of the image sensor described above.

The above-described image sensor may be used in various cases in which light such as visible light, infrared light, ultraviolet light, and X-ray is sensed as hereinafter described, for example.

A device which takes an image to be appreciated such as a digital camera and a mobile device having a camera function.

A device for transportation use such as a vehicle-mounted sensor which takes images of the front, back, surroundings, and inside of an automobile, a monitoring camera which monitors running vehicles and roads, and a ranging sensor which measures a distance between vehicles for safe driving such as automatic stop and recognition of a driver's condition.

A device for home electronics such as a television, a refrigerator, and an air conditioner which takes an image of a user gesture and performs device operation according to the gesture.

A device for medical and healthcare use such as an endoscope and a device which performs angiography by receiving infrared light.

A device for security use such as a security monitoring camera and an individual certification camera.

A device for beauty care such as a skin condition measuring device which takes an image of skin and a microscope which takes an image of scalp.

A device for sporting use such as an action camera and a wearable camera for sporting use.

A device for agricultural use such as a camera for monitoring land and crop states.

Meanwhile, the embodiments of the present technology are not limited to the above-described embodiments and various modifications may be made without departing from the scope of the present technology.

Furthermore, the present technology may have the following configurations.

(1) A solid-state imaging device including:
a photo diode formed on a substrate;
a floating diffusion which accumulates a signal charge read from the photo diode;
a plurality of vertical gate electrodes formed from a surface of the substrate in a depth direction in a region between the photo diode and the floating diffusion; and
an overflow path formed in a region interposed between the plurality of vertical gate electrodes.

(2) The solid-state imaging device according to (1), further including:
a planar gate electrode formed so as to stride across the photo diode and the floating diffusion on the substrate, in which
the vertical gate electrodes are formed integral with the planar gate electrode.

(3) The solid-state imaging device according to (1) or (2), in which
the overflow path is formed in a region shallower than the plurality of vertical gate electrodes.

(4) The solid-state imaging device according to any one of (1) to (3), further including:
a driving circuit which applies predetermined voltage to the plurality of vertical gate electrodes, in which
the driving circuit applies negative voltage larger than the negative voltage applied until then to the plurality of vertical gate electrodes at timing at which an opening mechanical shutter closes.

(5) An electronic device including:
a solid-state imaging device including:
a photo diode formed on a substrate;
a floating diffusion which accumulates a signal charge read from the photo diode;
a plurality of vertical gate electrodes formed from a surface of the substrate in a depth direction in a region between the photo diode and the floating diffusion; and
an overflow path formed in a region interposed between the plurality of vertical gate electrodes.

REFERENCE SIGNS LIST

10 CMOS image sensor
11 Pixel
13 Control circuit
14 Vertical driving circuit
32 Photo diode (PD)
33 Transfer gate electrode
33A Planar gate electrode
33B-1, 33B-2 Vertical gate electrode
34 Floating diffusion (FD)
35 Overflow path
100 Camera
101 Solid-state imaging device

The invention claimed is:

1. A solid-state imaging device comprising:
a photo diode formed on a substrate;
a floating diffusion which accumulates a signal charge read from the photo diode; and
a gate electrode comprising:
a planar gate electrode; and
a plurality of vertical gate electrodes formed from a surface of the substrate in a depth direction in a region between the photo diode and the floating diffusion; and
an overflow path formed in a region interposed between the plurality of vertical gate electrodes, wherein the overflow path is formed in a region shallower than the plurality of vertical gate electrodes.

2. The solid-state imaging device according to claim 1, wherein the plurality of vertical gate electrodes are in contact with the planar gate electrode.

3. The solid-state imaging device according to claim 1, wherein the plurality of vertical gate electrodes are formed integral with the planar gate electrode between the photo diode and the floating diffusion.

4. The solid-state imaging device according to claim 1, further comprising:
a driving circuit which applies a predetermined voltage to the plurality of vertical gate electrodes, wherein the driving circuit applies a negative voltage larger than a negative voltage applied until then to the plurality of vertical gate electrodes at a timing at which an opening mechanical shutter closes.

5. The solid-state imaging device according to claim 1, wherein the overflow path is a path for transferring an amount of signal charges that is beyond a saturation signal amount of the photo diode.

6. The solid-state imaging device according to claim 1, wherein the overflow path is modulated in two directions.

7. The solid-state imaging device according to claim 1, wherein the overflow path has a higher potential than the photo diode and the floating diffusion.

8. The solid-state imaging device according to claim 1, further comprising:
an overflow barrier of a predetermined potential between the photo diode and the floating diffusion.

9. The solid-state imaging device according to claim 1, wherein the floating diffusion is opposite the photo diode across the planar gate electrode.

10. The solid-state imaging device according to claim 1, wherein a saturation signal amount does not decrease with time when a mechanical shutter operates.

11. The solid-state imaging device according to claim 1, wherein each of the plurality of vertical gate electrodes has a columnar shape in the depth direction.

12. An electronic device comprising:
a solid-state imaging device including:
a photo diode formed on a substrate;
a floating diffusion which accumulates a signal charge read from the photo diode; and
a gate electrode comprising:
a planar gate electrode; and
a plurality of vertical gate electrodes formed from a surface of the substrate in a depth direction in a region between the photo diode and the floating diffusion; and
an overflow path formed in a region interposed between the plurality of vertical gate electrodes, wherein the overflow path is formed in a region shallower than the plurality of vertical gate electrodes.

13. The electronic device according to claim 12, wherein the plurality of vertical gate electrodes are in contact with the planar gate electrode.

14. The electronic device according to claim 12, wherein the plurality of vertical gate electrodes are formed integral with the planar gate electrode between the photo diode and the floating diffusion.

15. The electronic device according to claim 12, further comprising:
a driving circuit which applies a predetermined voltage to the plurality of vertical gate electrodes, wherein the driving circuit applies a negative voltage larger than a negative voltage applied until then to the plurality of vertical gate electrodes at a timing at which an opening mechanical shutter closes.

16. The electronic device according to claim 12, wherein the overflow path is a path for transferring an amount of signal charges that is beyond a saturation signal amount of the photo diode.

17. The electronic device according to claim 12, wherein the overflow path is modulated in two directions.

18. The electronic device according to claim 12, wherein the overflow path has a higher potential than the photo diode and the floating diffusion.

* * * * *